(12) United States Patent  
Navid

(10) Patent No.: US 8,643,414 B1
(45) Date of Patent: Feb. 4, 2014

(54) FAST LOCKING PHASE-LOCKED LOOP

(71) Applicant: Rambus Inc., Sunnyvale, CA (US)

(72) Inventor: Reza Navid, San Francisco, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/765,352

(22) Filed: Feb. 12, 2013

Related U.S. Application Data

(60) Provisional application No. 61/597,938, filed on Feb. 13, 2012.

(51) Int. Cl.
*H03L 7/06* (2006.01)

(52) U.S. Cl.
USPC .......................... 327/156; 327/147

(58) Field of Classification Search
USPC .................................. 327/147, 156
See application file for complete search history.

(56) References Cited

U.S. PATENT DOCUMENTS

| | | | |
|---|---|---|---|
| 6,107,848 A * | 8/2000 | Pickering et al. | 327/146 |
| 6,236,278 B1 * | 5/2001 | Olgaard | 331/25 |
| 6,696,829 B1 | 2/2004 | Nguyen | 324/76.53 |
| 7,579,886 B2 * | 8/2009 | Hufford et al. | 327/156 |
| 7,714,625 B2 | 5/2010 | Chatterjee et al. | 327/156 |
| 7,764,129 B1 | 7/2010 | Wong et al. | 331/44 |
| 8,502,579 B2 * | 8/2013 | Gomm | 327/158 |
| 2005/0189972 A1 | 9/2005 | Foo et al. | 327/156 |
| 2007/0182472 A1 * | 8/2007 | Cho | 327/175 |
| 2009/0115471 A1 * | 5/2009 | Choi | 327/149 |
| 2011/0001526 A1 * | 1/2011 | Hong et al. | 327/158 |
| 2011/0102029 A1 * | 5/2011 | Gomm | 327/149 |
| 2011/0228616 A1 | 9/2011 | Kim | 365/189.07 |
| 2011/0291718 A1 * | 12/2011 | Lee | 327/158 |
| 2012/0223755 A1 * | 9/2012 | Gomm | 327/158 |

* cited by examiner

*Primary Examiner* — Adam Houston
(74) *Attorney, Agent, or Firm* — The Neudeck Law Firm, LLC

(57) ABSTRACT

A phase-locked loop is placed in a low-power mode. The input to the variable-frequency oscillator is stored before the low-power mode is entered. Then, when the phase-locked loop is awakened, the previous input to variable-frequency oscillator is held at the input to the variable-frequency oscillator. While the input to variable-frequency oscillator is being held, the phase of the feedback signal is calibrated to the reference signal. Once the phase difference between the feedback signal and the reference signal is minimized, the normal feedback operation of the phase-locked loop is enabled.

21 Claims, 8 Drawing Sheets

FAST LOCKING PHASE-LOCKED LOOP

DETAILED DESCRIPTION

Figure 1:
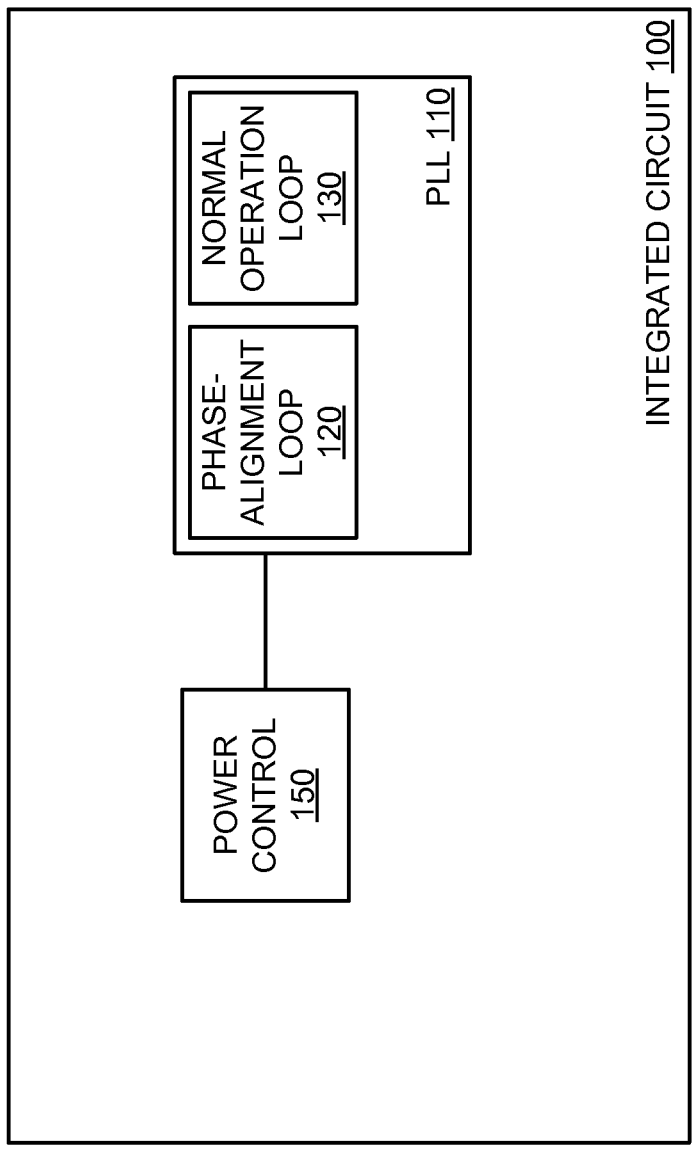
FIG. 1 is a block diagram of an integrated circuit.

In an embodiment, a phase-locked loop is placed in a low-power (sleep) mode. In this low-power mode, the variable frequency oscillator may be shut off or disabled. An input to a variable-frequency oscillator that controls the frequency of the variable frequency oscillator is stored before the low-power mode is entered. Then, when the phase-locked loop is awakened, the previous (i.e., pre-sleep mode) input to variable-frequency oscillator is held at the input to the variable-frequency oscillator. While the input to the variable-frequency oscillator is being held, the phase of a feedback signal is calibrated to the reference signal. Once the phase difference between the feedback signal and the reference signal is minimized, the normal feedback operation of the phase-locked loop is enabled (i.e., the input to the variable-frequency oscillator is allowed to be controlled by the loop filter). Thus, if the variable-frequency oscillator wakes up near the "right" frequency, calibrating the phase before resuming normal operation allows the phase-locked loop to quickly achieve a locked condition.

If the time spent in the low-power was relatively short, it can be assumed that the frequency of variable-frequency oscillator, when supplied with the same input, will not have drifted a large amount. Thus, the center frequency of the variable-frequency oscillator will either be at, or near, its locked condition. However, the phase of the feedback signal may have drifted significantly. By calibrating the phase of the feedback signal prior to enabling normal operation of the phase-locked loop, a locked condition may be achieved faster.

The input to the variable-frequency oscillator is easily stored when the variable-frequency oscillator is a digitally controlled oscillator (DCO). The input to a DCO is a digital number that can be stored in a register during the low-power mode. Thus, holding (restoring) the input to the DCO at its pre-sleep value is merely a matter of keeping that digital value the same while the phase of the feedback signal is calibrated.

It should be understood that the aforementioned phase-locked loop system may be described in terms of two feedback loops: one for normal operation, and one for startup (transition) from a low-power mode. While the first feedback loop is operating (i.e., feeding back), the second feedback loop is disabled, and visa versa.

The first feedback loop operates much like a conventional phase-locked loop feedback system. A feedback signal is compared to a reference signal to produce a phase-error signal. The phase-error signal is passed through a loop filter to provide a control input to a variable-frequency oscillator (VFO). The output of the VFO is typically the output signal of the phase-locked loop. A feedback path starts with the output of the VFO which is optionally passed through a frequency divider (÷N). The feedback path also passes through a phase-alignment circuit. The phase-alignment circuit produces the feedback signal to complete the first feedback loop.

During normal operation the phase-alignment circuit is maintaining a constant phase-delay from its input to its output. Thus, during normal operation, the phase-alignment circuit is not actively aligning the phase of the feedback signal to the reference signal. Instead, the phase/frequency of the feedback signal is adjusted by the VFO which is being controlled by the loop filter (which, in turn, receives the phase-error signal from a phase detector).

The second feedback loop may operate during transitions out of a low-power mode. The second feedback loop operates to minimize the phase difference between the feedback signal and the reference signal before the VFO is allowed to resume normal operation as part of the first feedback loop. The feedback signal is compared to a reference signal to produce a phase-error signal. The phase-error signal is used by the phase-alignment circuit to align the phase of the feedback signal to the reference signal. A perfect alignment may not be possible. Thus, the phase-alignment circuit adjusts the phase of the signal received from the output of the VFO (after optionally being passed through the frequency divider) to minimize the phase-error between the reference signal and the feedback signal. While the phase-alignment circuit is adjusting the phase of the feedback signal, the frequency of the VFO output is kept constant—thereby disabling the first feedback loop. After the second feedback loop has minimized the phase difference between the feedback signal and the reference signal, the VFO is allowed to resume normal operation as part of the first feedback loop, and the phase-alignment circuit stops actively aligning the phase of the feedback signal to the reference signal—thereby disabling the second feedback loop.

FIG. 1 is a block diagram of an integrated circuit. Integrated circuit 100 is a type of devices, such as is commonly referred to as a "chip". For example, integrated circuit 100 may be a microprocessor, a multi-core processor, a system-on-a-chip (SoC), a memory controller, a memory, a northbridge chip, an application specific integrated circuit (ASIC) device, a load-reduction memory buffer, a graphics processor unit (GPU). Integrated circuit 100 may be a device that includes many circuit blocks such as ones selected from graphics cores, processor cores, and MPEG encoder/decoders, etc. Integrated circuit 100 comprises phase-locked loop (PLL) 110 and power control circuitry 150. PLL 110 includes a phase-alignment loop 120 and a normal operation loop 130. Thus, it should be understood that PLL 110 may be equivalent to, or comprise, PLL 200 and PLL 300, described hereinafter.

Power control circuitry 150 is operatively coupled to PLL 110. Thus, power control circuitry 150 may control PLL to selectively activate/deactivate phase-alignment loop 120 or normal operation loop 130. Power control circuitry 150 may control PLL 110 to selectively activate/deactivate phase-alignment loop 120 or normal operation loop 130 in order to place PLL 110 in a low-power mode, a transition mode, or a normal operating mode.

Power control circuitry 150 may control PLL 110 such that the transition mode occurs as PLL 110 transitions from the low-power mode to the normal operating mode. Power control circuitry 150 may control PLL 110 such that normal operation loop 130 is disabled, and phase-alignment loop 120 is enabled, when PLL 110 is in the transition mode. Power control circuitry 150 may control PLL 110 such that normal operation loop 130 is enabled, and phase-alignment loop 120 is disabled, when PLL 110 is in the normal operating mode. Power control circuitry 150 may control PLL 110 such that normal operation loop 130 is disabled, and phase-alignment loop 120 is disabled, when PLL 110 is in the low-power mode.

Figure 2:
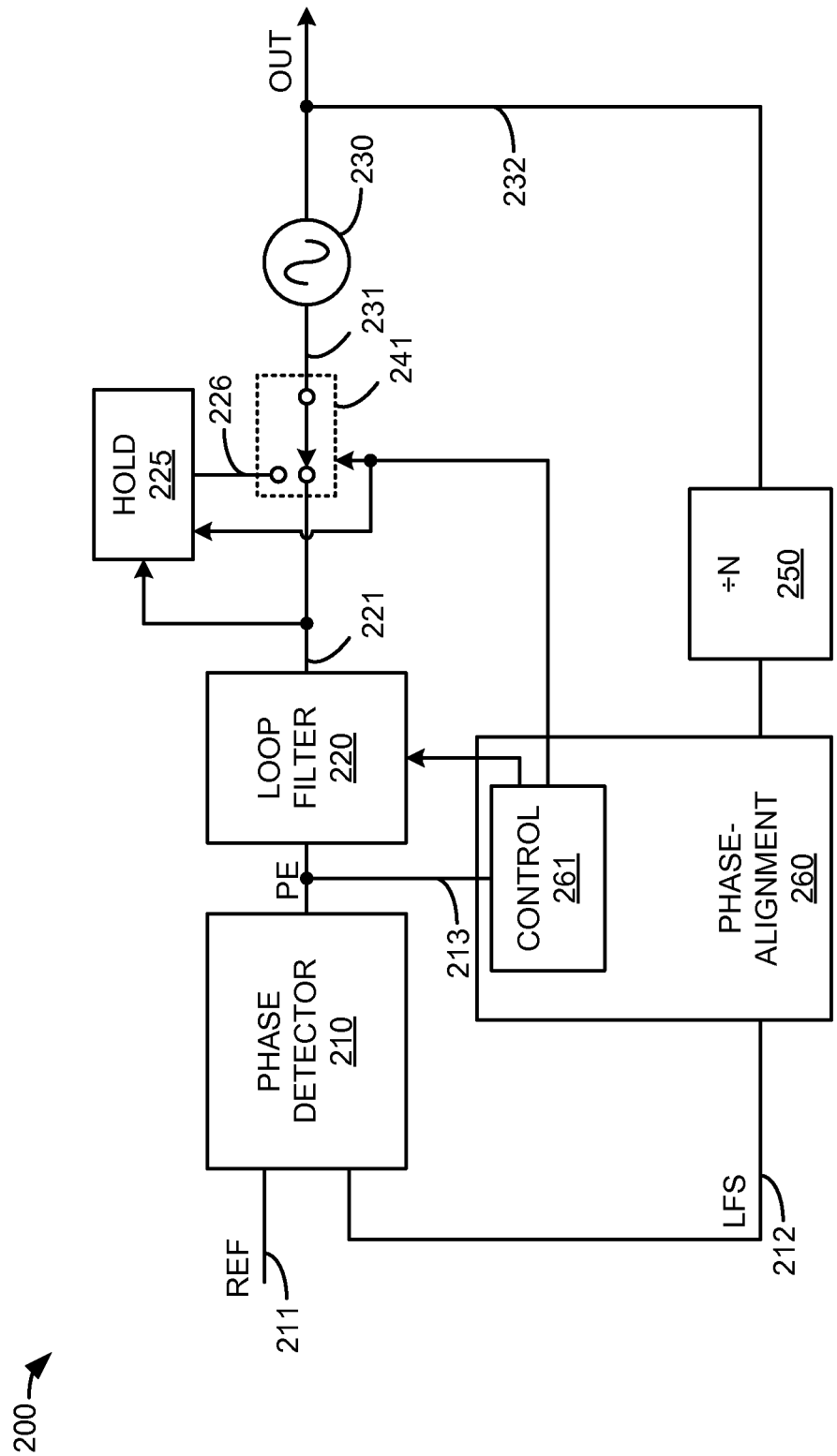
FIG. 2 is a block diagram illustrating a phase-locked loop.

FIG. 2 is a block diagram illustrating a phase-locked loop. Phase-locked loop (PLL) 200 comprises phase detector 210, loop filter 220, hold circuit 225, VFO 230, switch 241, divider 250, and phase-alignment circuit 260. Phase-alignment circuit 260 includes control 261. Phase detector 210 receives a reference signal 211 (REF) and a loop feedback signal 212 (LFS). Based on a phase comparison of the reference signal 211 and the feedback signal 212, phase detector 210 produces a phase-error signal 213 (PE). The phase-error signal 213 is coupled to an input of loop filter 220 and an input of phase-alignment circuit 260. The phase-error signal 213 is also shown in FIG. 2 coupled to control 261 of phase-alignment circuit 260.

In an embodiment, phase detector 210 may be a bang-bang phase-frequency detector. In another embodiment, phase detector 210 may be a time-to-digital converter (TDC). VFO 230 may be a voltage controlled oscillator (VCO). VFO 230 may be a digitally controlled oscillator (DCO). In an embodiment, where VFO 230 is a VCO, hold circuit 225 may be an analog sample-and-hold circuit. In an embodiment where VFO 230 is a DCO, hold circuit 225 may be a register or other digital memory. Likewise, when VFO 230 is a VCO, loop filter 220 may be an analog circuit such as an analog low-pass filter. When VFO 230 is a DCO, loop filter 220 may be a digital circuit such as a digital loop filter.

In FIG. 2, the output 221 of loop filter 220 is coupled to hold circuit 225 and a first terminal of single-pole double-throw switch 241. The output of hold circuit 225 is coupled to a second terminal of switch 241. The common terminal of switch 241 is coupled to the input 231 of variable-frequency oscillator 230. A control input of hold circuit 225, a control input of switch 241, and a control input of loop filter 220 are operatively coupled to control 261. Thus, control circuit 261 can control hold circuit 225 and switch 241 to provide the input 231 VFO 230 with either the output 221 of loop filter 220 or a held (or stored) value 226 from hold circuit 225. Control circuit 261 can also control loop filter 220 to disable (and enable) the accumulation or integration of phase-error signal 213.

It should be understood that switch 241 is intended to merely illustrate the functionality required to enable and disable loop filter 220's control of VCO 230. Other circuits such as multiplexers, registers, logic gates, pass-gates, or enable/disable control of loop filter 220 or VCO 230 may be used The output of VFO 230 is shown as the output of PLL 200 (OUT). The output of VFO 230 is also coupled to the input of optional divider 250. The output of divider 250 is coupled to phase-alignment circuit 260. The output of phase-alignment circuit 260 is feedback signal 212. In an embodiment (not shown), all or part of the frequency division of the feedback loop performed by divider 250 is performed on the phase-adjusted signal 212. In this case, glitch-free multiplexers may be added at the output of divider 250 to select the right phase to be coupled to phase detector 210. Glitch-free multiplexers operate in a fashion that avoids extraneous spike or "glitch" which may be interpreted by phase detector as one or more transitions.

PLL 200 may be placed in a low-power mode. In this mode, VFO 230 may not output an oscillating signal at its output 232. Prior to, contemporaneous with, or after VFO 230 is controlled to stop oscillating, control 261 may control hold circuit 225 to preserve the input 231 to VFO 230 while PLL 200 is in the low-power mode. Also when in the low-power mode, control 261 may control loop filter 220 to disable the accumulation or integration of phase error signal 213. Disabling the accumulation or integration of phase error signal 213 keeps the output of the loop filter at or near the value it had before the low-power mode was entered.

Before PLL 200 exits the low-power mode, control 261 may control switch 241 to couple the output 226 of hold circuit 225 to the input 231 of VFO 230. This keeps the input 231 of VFO 230 at the previously preserved input level. Thus, when VFO 230 is controlled to start oscillating again, if the conditions inside VFO 230 have not changed significantly (such as when the low-power mode was only maintained for a relatively short time), VFO 230 will start oscillating again at approximately the same frequency as before the low-power mode was entered. Also, because the input 231 to VFO 230 is coming from hold circuit 225, VFO 230 will continue to oscillate at approximately the same frequency without being adjusted by loop filter 220.

While the input 231 of VFO 230 is at the previously preserved input level, control 261 may adjust the delay between divider 250 and phase detector 210 to minimize the phase-error between feedback signal 212 and reference signal 211. Once phase-alignment circuit 260 has minimized the phase-error between feedback signal 212 and reference signal 211, control 261 may hold the delay between divider 250 and phase detector 210 constant and control switch 241 to couple the output 221 of loop filter 220 to the input 231 of VFO 230. This enables loop filter 220 to control VFO 230 such that PLL 200 can achieve a phase-frequency lock condition. Because the accumulation or integration of phase error signal 213 was disabled during the low-power mode so that the output 221 of the loop filter 220 is at or near the value it had before the low-power mode was entered, the output 221 of the loop filter 220 will not have drifted and thus the output 221 of the loop filter 220 will be at or near a value needed to achieve phase lock—thereby facilitating the rapid locking of PLL 200 after exiting the low-power mode. When the delay between divider 250 and phase detector 210 is being held constant, and loop filter 220 is controlling the input 231 of VFO 230, PLL 200 can be said to be in "normal" (i.e., operating like a conventional PLL) operation.

In FIG. 2, and the rest of this specification, REF, LFS, OUT, and other signals are shown as single ended signals. This is done merely for clarity of presentation. It should be understood that in all of the Figures, embodiments, and discussions, REF, LFS, OUT, or any other signals (e.g., PE) may encompass both single-ended signals carried on a single line, and complementary or differential signals carried on two lines. In other words, for example, the line connecting divider 250 to phase-alignment 260 in FIG. 2 should be understood to represent one single-ended signal carried on a single signal line, or alternatively two complementary or differential signals, carried on two signal lines. Likewise, the waveforms illustrated in FIG. 6, for example, should be understood to convey the state of one single-ended signal, or alternatively the state of a complementary or differential signal.

Figure 3:
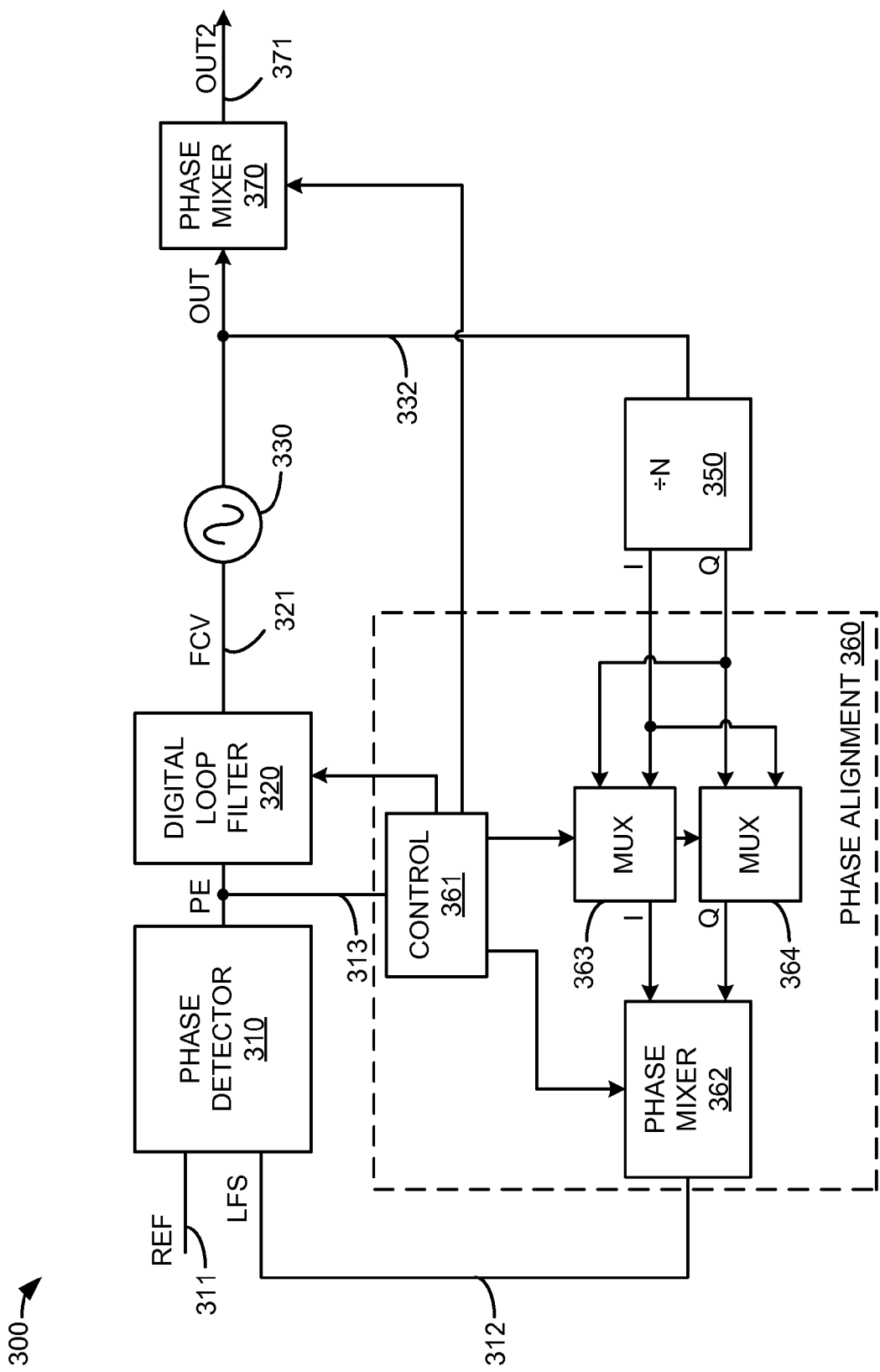
FIG. 3 is a block diagram illustrating a digital phase-locked loop.

FIG. 3 is a block diagram illustrating a digital phase-locked loop. Phase-PLL 300 comprises phase detector 310, digital loop filter 320, VFO 330, divider 350, and phase-alignment circuit 360. Phase-alignment circuit 360 includes control 361, phase mixer 362, multiplexer (MUX) 363, and MUX 364.

MUX 363 and MUX 364 are shown as two-to-one (2:1) MUXs. Thus, MUX 363 and MUX 364 have a first data input, a second data input, a control input, and an output. The output of MUX 363 and the output of MUX 364 are coupled to phase mixer 362. The control inputs of MUX 363 and MUX 364 are received from control 361. Likewise, the control input of phase mixer 362 is received from control 361. In an embodiment, MUX 363 and MUX 364 are glitch-free MUXs. In other words, when the control input of MUX 363 or MUX 364 is switched, the output transitions without an extraneous spike or "glitch" which may be interpreted by phase detector 310 as one or more transitions.

Phase detector 310 receives a reference signal 311 (REF) and a loop feedback signal 312 (LFS). Based on a phase comparison of the reference signal 311 and the feedback signal 312, phase detector 310 produces a phase-error signal 313 (PE). The PE signal 313 may be a digital value or a digital signal. The PE signal 313 is coupled to an input of loop filter 320 and an input of phase-alignment circuit 360. The PE signal 313 is shown in FIG. 3 is coupled to control 361 of phase-alignment circuit 360. In an embodiment, phase detector 310 may be a bang-bang phase-frequency detector. In another embodiment, phase detector 310 may be a linear TDC. VFO 330 may be a digitally controlled oscillator (DCO).

In FIG. 3, the frequency control value signal (FCV) 321 output by loop filter 320 is coupled to variable-frequency oscillator 330. A control input of loop filter 320 is coupled to control 361. Thus, control circuit 361 can control loop filter 320 to provide VCO 330 with either a held (or stored) value, or a value that is changing based on the PE signal 313. Control circuit 361 can also control loop filter 320 to disable (and enable) the accumulation or integration of PE signal 313.

The output of VFO 330 (OUT 332) is shown coupled to the input of optional divider 350 and optional phase mixer 370. The output 371 of phase mixer 370 is shown as the signal OUT2. OUT2 may be provided to other parts of a system or integrated circuit containing PLL 300.

The in-phase (I) and quadrature-phase (Q) outputs of divider 350 are coupled to phase-alignment circuit 360. The output of phase-alignment circuit 360 is feedback signal 312. The I output of divider 350 is coupled to a first input of MUX 363 and a second input of MUX 364. The Q output of divider 350 is coupled to a second input of MUX 363 and a first input of MUX 364. The output of MUX 363 is labeled as an in-phase output (I) and is provided to phase mixer 362. The output of MUX 364 is labeled as a quadrature-phase output (Q) and is provided to phase mixer 362. Thus, by controlling the select inputs of MUX 363 and MUX 364, I and Q signals may be sent to phase mixer 362 which have one of four quarter cycle phase alignments. This rough (i.e., within ¼ of a cycle) phase alignment can be further adjusted by phase mixer to provide a feedback signal 312 that may be phase aligned over a full cycle of the reference signal REF. The rough phase alignment may be adjusted by phase mixer 362 in a fashion that avoids an extraneous spike or "glitch" which may be interpreted by phase detector 310 as one or more transitions.

In another embodiment (not shown), all or part of the frequency division of the feedback loop performed by divider 350 is performed on the phase-adjusted signal 312. In this case, glitch-free multiplexers may be added at the output of divider 350 to select the right phase to be coupled to phase detector 310. Glitch-free multiplexers operate in a fashion that avoids extraneous spike or "glitch" which may be interpreted by phase detector as one or more transitions.

PLL 300 may be placed in a low-power mode. In this mode, VFO 330 may not output an oscillating signal at its output 332. Prior to, contemporaneous with, or after VFO 330 is controlled to stop oscillating, digital loop filter 320 may preserve its output to VFO 330 while PLL 300 is in the low-power mode. Also when in the low-power mode, loop filter 120 may be controlled to disable the accumulation or integration of PE signal 313. Disabling the accumulation or integration of PE signal 313 keeps the output 321 of loop filter 320 at or near the value it had before the low-power mode was entered. PLL 300 may exit the low-power mode by controlling VFO 330 to start oscillating again.

As VFO 330 starts oscillating again, digital loop filter 320 may be controlled to hold the preserved value at its output while phase alignment circuit 360 minimizes the phase difference between LFS 312 and REF 311. This keeps the input of VFO 330 at the previously preserved input value. Thus, if the conditions inside VFO 330 have not changed significantly, VFO 330 starts oscillating again at approximately the same frequency as before the low-power mode was entered. Also, because digital loop filter is holding it output constant, VFO 330 continues to oscillate at approximately the same frequency and no adjustments to the frequency of VFO 330 are made by digital loop filter 320.

While FCV 321 is held at the previously preserved value, control 361 adjusts the delay between divider 350 and phase detector 310 to minimize the phase-error between feedback signal 312 and reference signal 311. Once phase-alignment circuit 360 has minimized the phase-error between feedback signal 312 and reference signal 311, control 361 holds the delay between divider 350 and phase detector 310 constant and allows digital loop filter 320 to adjust FCV 321 in order to minimize the phase difference between feedback signal 312 and reference signal 311. Thus, digital loop filter 320 will control VFO 330 such that PLL 300 achieves a phase-frequency lock condition. Because the accumulation or integration of PE signal 313 was disabled during the low-power mode so that the output 321 of the loop filter 320 is at the value it had before the low-power mode was entered, the output 321 of the loop filter 320 will not have drifted and thus the output 321 of the loop filter 320 will be at or near a value needed to achieve phase lock—thereby facilitating the rapid locking of PLL 300 after exiting the low-power mode.

The delay between divider 350 and phase detector 310 may vary each time PLL 300 is brought out of low-power mode. Accordingly, this may result in a different delay between the reference signal REF 311 and the output 332 of VFO 330 each time PLL 300 is brought out of low-power mode. To compensate for this, control 361, may control phase mixer 370 to "null out" this variable delay before the signal OUT2 371 is sent to other parts of a system or integrated circuit. Control 361 may compensate for this variable delay by controlling phase mixer 370 such that the delay between the reference signal REF 311 and the signal OUT2 371 is the same, or approximately the same, regardless of the different delays between the reference signal REF 311 and the output 332 of VFO 330.

Figure 4:
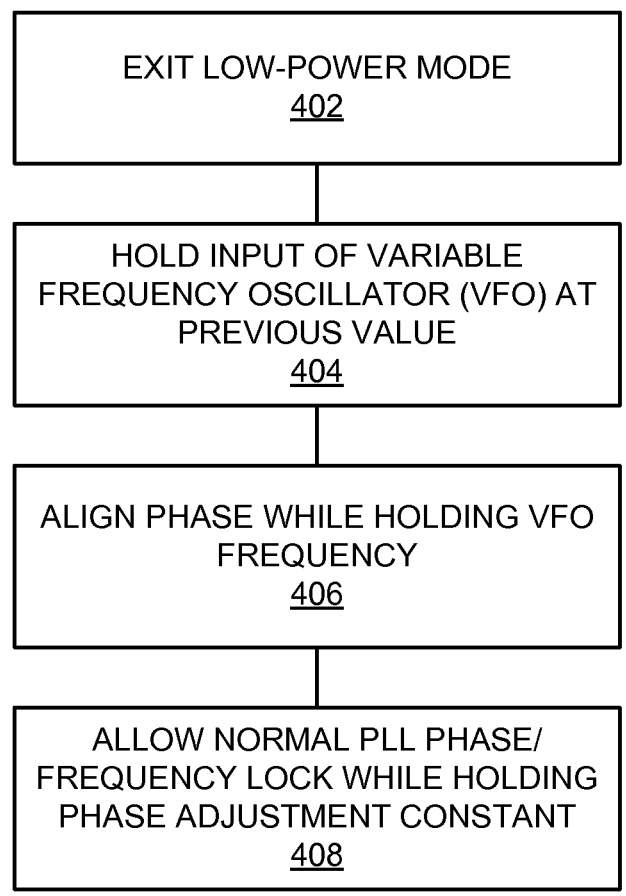
FIG. 4 is a flowchart illustrating a method of locking a phase-locked loop.

FIG. 4 is a flowchart illustrating a method of locking a phase-locked loop. The steps illustrated in FIG. 3 may be performed by one or more elements of PLL 200 or PLL 300. A low-power mode is exited (402). For example, PLL 200 may exit a low-power mode. In this low-power mode, the VFO 230 of PLL 200 may be kept from oscillating. In another embodiment, the reference signal 211 may not be provided to PLL 200.

The input of a variable-frequency oscillator may be held at a previous value (404). For example, hold circuit 225 may provide a previous input to VFO 230. This previous input may be determined by the output of loop filter 220 during a lock condition of PLL 200 prior to PLL 200 being placed in the low-power mode. A phase is aligned while holding the VFO frequency (406). For example, while VFO 230 is holding its frequency, phase-alignment circuit 260 may adjust the delay between divider 250 and phase detector 210 to minimize the phase-error between feedback signal 212 and reference signal 211.

Normal PLL phase/frequency lock is allowed while holding the phase adjustment constant (408). For example, once phase-alignment circuit 260 has minimized the phase-error between feedback signal 212 and reference signal 211, control 261 may hold the delay between divider 250 and phase detector 210 constant, and control switch 241 to couple the output 221 of loop filter 220 to the input of VFO 230. This enables loop filter 220 to control VFO 230 such that PLL 200 can achieve a phase-frequency lock condition.

Figure 5:
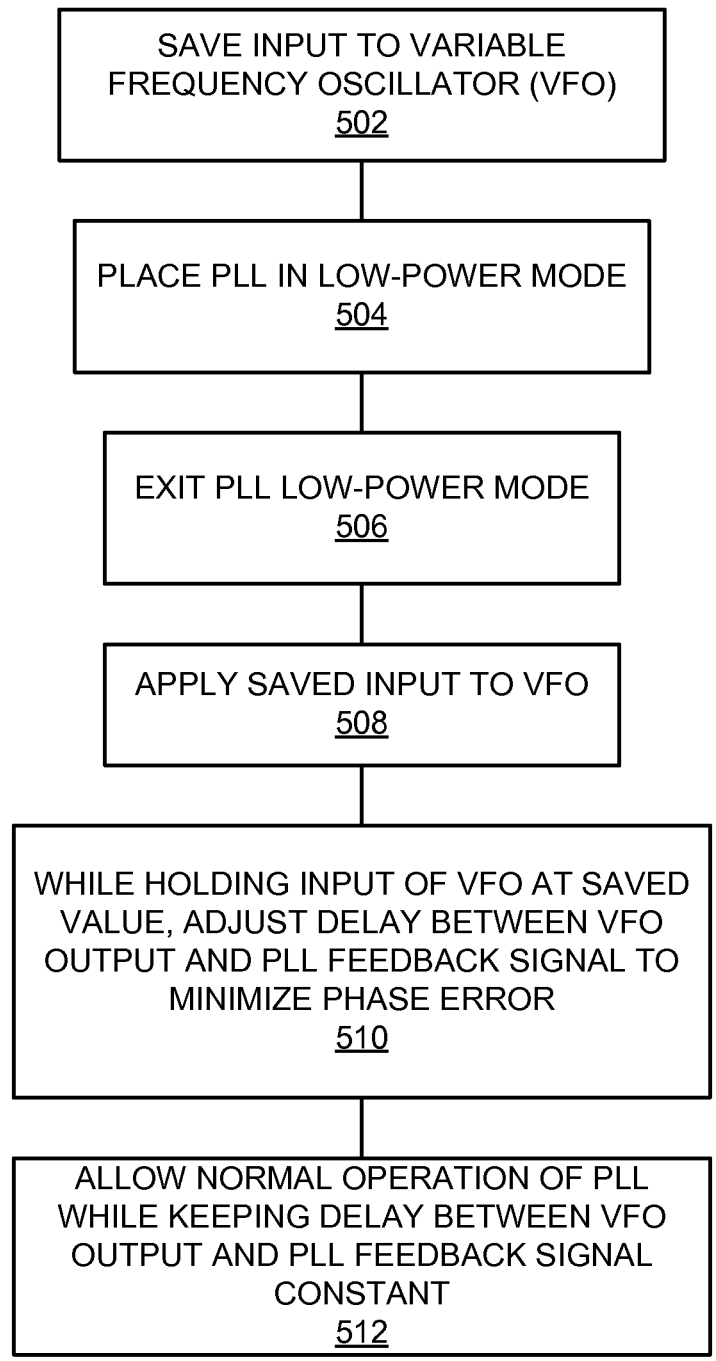
FIG. 5 is a flowchart illustrating a method of operating a phase-locked loop.

FIG. 5 is a flowchart illustrating a method of operating a phase-locked loop. The steps illustrated in FIG. 4 may be performed by one or more elements of PLL 200 or PLL 300. An input to a VFO is saved (502). For example, while in a locked condition, digital loop filter 320 may save (or store) its output FCV 321. The PLL is placed in a low-power mode (504). For example, VFO 330 may be controlled to not output an oscillating signal at its output 332.

The PLL exits the low-power mode (506). For example, PLL 300 may exit the low-power mode by allowing, or controlling, VFO 330 to start oscillating again. The saved input is applied to the VFO (508). For example, as VFO 330 resumes oscillating, the saved value of FCV 321 may be applied to VFO 330. While holding the input of the VFO at the saved value, the delay between the VFO output and PLL feedback signal is adjusted to minimize phase error (510). For example, while FCV 321 is held at the previously saved value, control 361 may adjust the delay between divider 350 and phase detector 310 to minimize the phase-error between feedback signal 312 and reference signal 311. While keeping the delay between the VFO output and the PLL feedback signal constant, normal operation of the PLL is allowed (512). For example, once phase-alignment circuit 360 has minimized the phase-error between feedback signal 312 and reference signal 311, control 361 may hold the delay between divider 350 and phase detector 310 constant and allow digital loop filter 320 to adjust FCV 321 in order to minimize the phase difference between feedback signal 312 and reference signal 311. Thus, after phase-alignment circuit 360 has minimized the phase-error between feedback signal 312 and reference signal 311, PLL 300 is operated normally whereby the delay between divider 350 and phase detector 310 is held constant and digital loop filter 320 is controlling VFO 330 such that PLL 300 achieves a phase-frequency lock condition.

Figure 6:
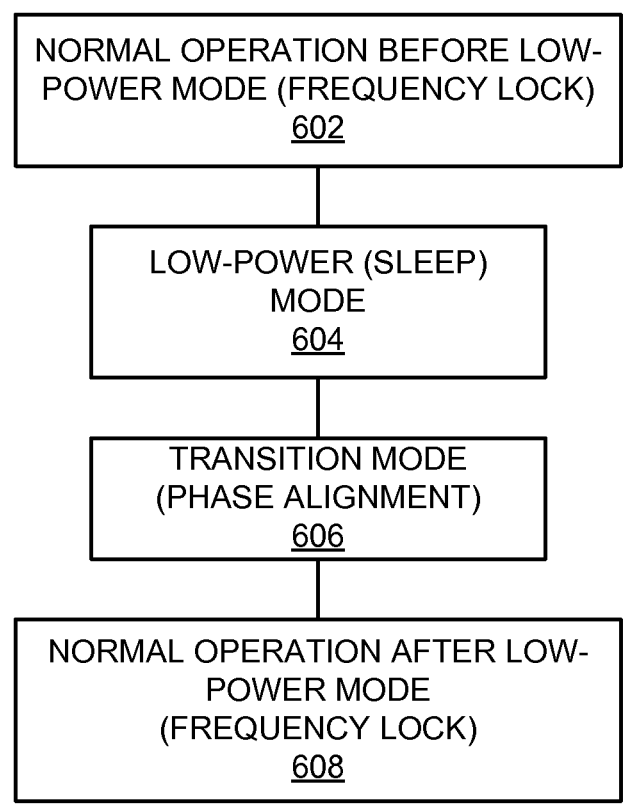
FIG. 6 is a flowchart illustrating a method of operating a phase-locked loop in a plurality of modes.

FIG. 6 is a flowchart illustrating a method of operating a phase-locked loop in a plurality of modes. The steps through the modes illustrated in FIG. 5 may be performed by one or more elements of PLL 200 or PLL 300. The first mode is normal operation in frequency lock before low-power operation (602). In this mode, for example, the delay between divider 350 and phase detector 310 is held constant and digital loop filter 320 is controlling VFO 330 such that PLL 300 achieves a phase-frequency lock condition.

A low-power (i.e., sleep) mode is entered (604). In this mode, for example, VFO 330 may be controlled to not output an oscillating signal at its output 332. In order to resume normal operation, a transition mode is entered (606). In this mode, phase-alignment is performed while holding the frequency of the PLL constant. For example, as VFO 330 resumes oscillating, a saved value of FCV 321 may be applied to VFO 330. While the saved value is applied to VFO 330, the delay between the output of divider 350 and PLL feedback signal 312 may be adjusted to minimize the phase-error between feedback signal 312 and reference signal 311.

Normal operation in frequency lock after low-power mode is entered (608). For example, the delay between divider 350 and phase detector 310 may be held constant while digital loop filter 320 is allowed to adjust FCV 321 in order to minimize the frequency-phase difference between feedback signal 312 and reference signal 311. In this mode, digital loop filter 320 is controlling VFO 330 such that PLL 300 achieves a phase-frequency lock condition.

Figure 7:
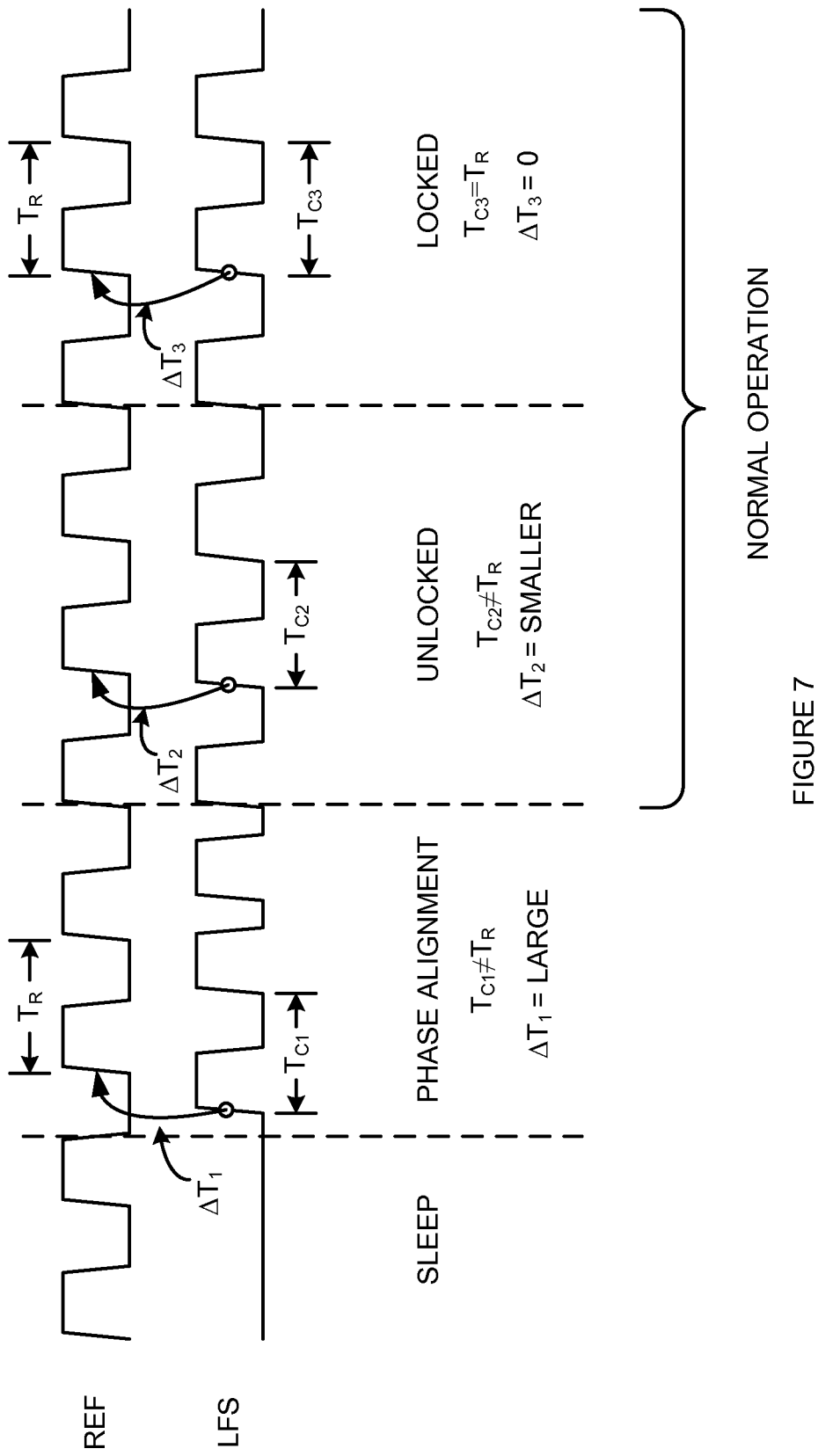
FIG. 7 is a timing diagram illustrating a locking operation of a phase-locked loop.

FIG. 7 is a timing diagram illustrating a locking operation of a phase-locked loop. The timings illustrated in FIG. 7 may correspond to timings of signals and operation of PLL 200 or PLL 300. In FIG. 7, a reference signal (REF) is shown periodically cycling with a period of $T_R$. During a first period of operation (sleep), an output signal of a PLL (OUT) is shown at a constant level. This period may correspond to a low-power mode such as when VFO 230 or VFO 330 is not oscillating, described previously.

After the first period of operation, a phase alignment period of operation is illustrated. During this period of operation, REF continues to cycle with a period of $T_R$. At the start of this period of operation, OUT transitions from a constant value to periodically cycling with a period $T_{C1}$. OUT is held to periodically cycling with a period $T_{C1}$ throughout the phase-alignment period. In addition, the rising edge of OUT is shown leading REF by a period of $\Delta T_1$. This period corresponds to the transition mode where the frequency of the VFO is being held constant while phase-alignment takes place. During this period, $T_{C1} \neq T_R$ and $\Delta T_1$ may be large (i.e., the PLL is out of both phase and frequency lock). It should be noted, however, that $T_{C1}$ may be approximately $T_R$ (i.e., the frequency of OUT may be close to that of REF).

By the end of the phase-alignment period, the phase of REF and OUT have been aligned. This is illustrated by the coincidence of the rising edges of REF and OUT at the boundary of the second and third periods (phase-alignment and unlocked, respectively). Because the frequencies of OUT and REF may not match yet (i.e., $T_{C2} \neq T_R$), a small phase error may develop between OUT and REF. This is illustrated by $\Delta T_2$ which is shown as being smaller than $\Delta T_1$. During this period, the PLL is in normal operation, but has not achieved a locked condition.

In response to the phase error between LFS and REF, the frequency of OUT is adjusted in the unlocked period until both the phase and frequency of REF and OUT match. This condition marks the boundary between the unlocked period and the locked period. In FIG. 7, during the locked period, $T_{C3} = T_R$ and $\Delta T_3$ approaches zero.

The systems and devices described above may be implemented in computer systems, integrated circuits, or stored by computer systems. The systems described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of PLL 200, PLL 300, integrated circuit 100, and their components. These software descriptions may be: behavioral, register transfer, logic component, transistor, and layout geometry-level descriptions. Moreover, the software descriptions may be stored on non-transitory storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, Blu-Ray, and so on.

Figure 8:
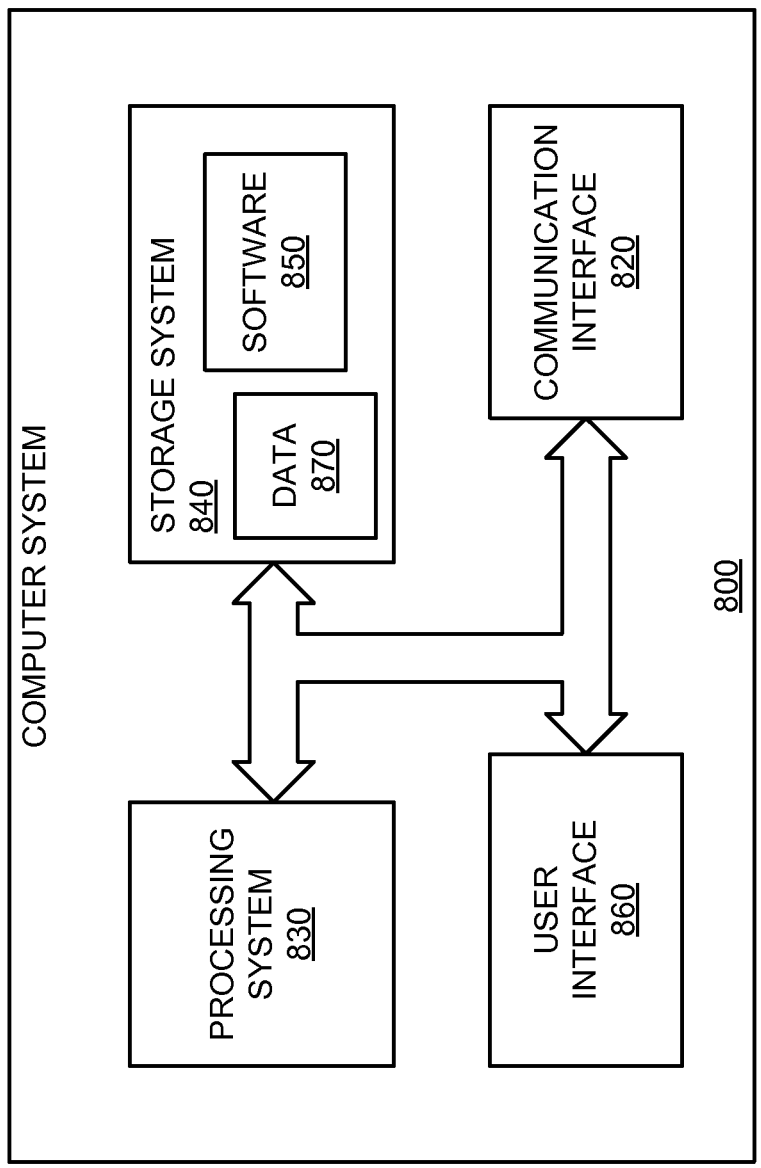
FIG. 8 is a block diagram of a computer system.

FIG. 8 illustrates a block diagram of a computer system. Computer system 800 includes communication interface 820, processing system 830, storage system 840, and user interface 860. Processing system 830 is operatively coupled to storage system 840. Storage system 840 stores software 850 and data 870. Computer system 800 may include one or more of integrated circuit 100, PLL 200, PLL 300, or components that implement the methods, circuits, and/or modes described herein. Processing system 830 is operatively coupled to communication interface 820 and user interface 860. Computer system 800 may comprise a programmed general-purpose computer. Computer system 800 may include a microprocessor. Computer system 800 may comprise programmable or special purpose circuitry. Computer system 800 may be distributed among multiple devices, processors, storage, and/or interfaces that together comprise elements 820-870.

Communication interface 820 may comprise a network interface, modem, port, bus, link, transceiver, or other communication device. Communication interface 820 may be distributed among multiple communication devices. Processing system 830 may comprise a microprocessor, microcontroller, logic circuit, or other processing device. Processing system 830 may be distributed among multiple processing devices. User interface 860 may comprise a keyboard, mouse, voice recognition interface, microphone and speakers, graphical display, touch screen, or other type of user interface device. User interface 860 may be distributed among multiple interface devices. Storage system 840 may comprise a disk, tape, integrated circuit, RAM, ROM, EEPROM, flash memory, network storage, server, or other memory function. Storage system 840 may include computer readable medium. Storage system 840 may be distributed among multiple memory devices.

Processing system 830 retrieves and executes software 850 from storage system 840. Processing system 830 may retrieve and store data 870. Processing system 830 may also retrieve and store data via communication interface 820. Processing system 830 may create or modify software 850 or data 870 to achieve a tangible result. Processing system 830 may control communication interface 820 or user interface 860 to achieve a tangible result. Processing system 830 may retrieve and execute remotely stored software via communication interface 820.

Software 850 and remotely stored software may comprise an operating system, utilities, drivers, networking software, and other software typically executed by a computer system. Software 850 may comprise an application program, applet, firmware, or other form of machine-readable processing instructions typically executed by a computer system. When executed by processing system 830, software 850 or remotely stored software may direct computer system 800 to operate.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A phase-locked loop, comprising:
a variable-frequency oscillator to produce a first signal;
a phase detector to receive a reference signal and a feedback signal;
a phase-alignment circuit to receive the first signal and an output of the phase detector, the phase-alignment circuit to produce a phase adjusted signal based on the first signal, the phase adjusted signal to be used as the feedback signal;
a loop filter to receive the output of the phase detector; and,
wherein, after a reactivation of the phase-locked loop but before the loop filter controls the variable-frequency oscillator to adjust a frequency of the first signal, a phase adjustment of the feedback signal is to be made by the phase-alignment circuit to calibrate a phase differential between the feedback signal and the reference signal.

2. The phase-locked loop of claim 1, wherein said variable-frequency oscillator is a digitally controlled oscillator (DCO).

3. The phase-locked loop of claim 1, wherein, based on the output of the phase detector, the phase-alignment circuit is to adjust the phase adjusted signal to minimize a phase error between the reference signal and the feedback signal.

4. The phase-locked loop of claim 1, wherein the phase-alignment circuit comprises a phase-mixer.

5. The phase-locked loop of claim 4, wherein the phase-alignment circuit comprises glitch-free multiplexers to adjust the phase adjusted signal to within ¼ of a cycle.

6. The phase-locked loop of claim 5, wherein the phase adjusted signal is to be further adjusted by the phase mixer to phase align the feedback signal over a full cycle of the reference signal.

7. The phase-locked loop of claim 2, wherein a DCO input value determines a frequency of the first signal and a first DCO input value is to be used before deactivation and after the reactivation of the phase-locked loop but before the loop filter adjusts the DCO input value thereby to cause the DCO to adjust a frequency of the first signal.

8. The phase-locked loop of claim 1, further comprising:
a phase-mixer to receive the first signal and to output a second signal, the second signal to have an approximately constant delay between the reference signal and the second signal regardless of different delays between the reference signal and the first signal.

9. A phase-locked loop, comprising:
a variable oscillator to generate a first signal;
a phase detector to receive a reference signal and a feedback signal;
a phase-alignment circuit to receive the first signal and an output of the phase detector, the phase-alignment circuit to generate a phase adjusted signal based on the first signal,
a loop filter to receive the output of the phase detector; and,
wherein, after a reactivation of the phase-locked loop but before the loop filter controls the variable oscillator to adjust a frequency of the first signal, a phase adjustment of the phase adjusted signal is to be made by the phase-alignment circuit to calibrate a phase differential between the phase adjusted signal and the reference signal.

10. The phase-locked loop of claim 7, wherein the variable oscillator is a digitally controlled oscillator (DCO).

11. The phase-locked loop of claim 7, wherein, based on the output of the phase detector, the phase-alignment circuit is to adjust the phase adjusted signal to minimize a phase error between the reference signal and the feedback signal.

12. The phase-locked loop of claim 7, wherein the phase-alignment circuit comprises a phase-mixer.

13. The phase-locked loop of claim 12, wherein the phase-alignment circuit comprises glitch-free multiplexers to adjust the phase adjusted signal to within ¼ of a cycle.

14. The phase-locked loop of claim 13, wherein the phase adjusted signal is to be further adjusted by the phase mixer to phase align the feedback signal over a full cycle of the reference signal.

15. The phase-locked loop of claim 10, wherein a DCO input value determines a frequency of the first signal and a first DCO input value is to be used before deactivation and after the reactivation of the phase-locked loop but before the loop filter adjusts the DCO input value thereby causing the DCO to adjust a frequency of the first signal.

16. The phase-locked loop of claim 9, further comprising:
a phase-mixer to receive the first signal and to output a second signal, the second signal to have an approximately constant delay between the reference signal and the second signal thereby compensating for variations in the phase differential between the phase adjusted signal and the reference signal.

17. A method of locking a phase-locked loop, comprising:
holding a first input of a variable-frequency oscillator, the first input determining a frequency of an output signal of the variable-frequency oscillator, the variable-frequency oscillator being part of a feedback loop of the phase-locked loop;
while the first input is being held, producing a phase adjusted signal based on the output signal of the variable-frequency oscillator, the phase adjusted signal controlled to minimize a phase difference between a reference signal and the phase adjusted signal, as measured by a phase detector; and,
after the phase difference between a reference signal and the phase adjusted signal is minimized, allowing the feedback loop of the phase-locked loop to adjust this first input to match the frequency of the output signal of the variable-frequency oscillator to a frequency of the reference signal.

18. The method of claim 17, wherein the first input comprises a digital value.

19. The method of claim 17, wherein the first input is held at a value corresponding to prior lock condition of the phase-locked loop.

20. The method of claim 17, wherein producing the phase adjusted signal based on the output signal of the variable-frequency oscillator comprises controlling a phase-mixer to minimize the phase difference between the reference signal and the phase adjusted signal, as measured by the phase detector.

21. The method of claim 17, further comprising:
holding, after the phase difference between a reference signal and the phase adjusted signal is minimized, a second input that determines a phase of the phase adjusted signal.

* * * * *